(12) United States Patent  
Kim

(10) Patent No.: US 6,210,842 B1
(45) Date of Patent: Apr. 3, 2001

(54) METHOD FOR FABRICATING STENCIL MASK

(75) Inventor: Cheol Kyun Kim, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/398,027

(22) Filed: Sep. 17, 1999

(30) Foreign Application Priority Data

Sep. 21, 1998 (KR) .................................................. 98-39083

(51) Int. Cl.⁷ .................................. G03F 9/00; G03C 5/00
(52) U.S. Cl. .................................................. 430/5; 430/296
(58) Field of Search ............................ 430/5, 322, 323, 430/296; 378/35

(56) References Cited

U.S. PATENT DOCUMENTS 5,520,297 * 5/1996 Kagami et al. ......................... 430/5
5,763,121   6/1998 Randall ................................... 430/5
5,858,576   1/1999 Takashi et al. ......................... 430/5

FOREIGN PATENT DOCUMENTS 0 866372 A1   9/1998 (EP) .

* cited by examiner

*Primary Examiner*—S. Rosasco
(74) *Attorney, Agent, or Firm*—Nath & Associates, PLLC; Gary M. Nath; Harold L. Novick

(57) ABSTRACT

Disclosed herein is a method of fabricating a stencil mask to be used in an E-beam lithographic process. The method comprises, after forming a silicon nitride film over the entire surface of a wafer, a step of dividing the silicon nitride film into at least two sub-portions to form silicon nitride film patterns. A stress applied to the silicon nitride film is thus reduced.

3 Claims, 7 Drawing Sheets

METHOD FOR FABRICATING STENCIL MASK

BACKGROUND OF THE INVENTION

1. Field of the Invention

The present invention relates in general to a method for fabricating a stencil mask to be used in a lithographic process, and more particularly to a method for fabricating a stencil mask to be used in an E-beam process.

2. Description of the Prior Art

In general, a silicon-on-insulator (SOI) wafer is useful as a cell projection type mask. The SOI device is formed in such a manner that, on a semiconductor substrate, there is a formed silicon oxide film serving as an insulating film on which a silicon layer is then formed.

In this sense, a method for the fabrication of a stencil mask according to the prior art will now be described below with reference to FIGS. 1 through 7.

FIGS. 1 through 7 are cross-sectional views illustrating a method of fabricating a cell projection type mask according to the prior art, respectively. The prior method for fabricating the cell projection type mask comprises a process of forming a SOI substrate. The SOT substrate, as shown in FIG. 1, consists of a semiconductor substrate 10 on which a buried oxide film 12 and a silicon layer 14 are sequentially formed.

After that, as shown in FIG. 2, a first photoresist film pattern 16 of a selected thickness is formed on an upper surface of the SOI substrate.

Next, using the first photoresist film pattern 16 as a mask, the silicon layer 14 is patterned, as shown in FIG. 3. Then, the first photoresist film 16 (FIG. 2) is removed.

Afterwards, a first silicon oxide film 18 is formed on a lower surface of the semiconductor substrate 10, and then, a silicon nitride film 20 and a second silicon oxide film 22 are formed sequentially on lower and upper surfaces of an entire structure, as shown in FIG. 4. At this time, the first silicon oxide film 18, the silicon nitride film 20, and the second silicon oxide film 22 are formed over the entire surface of a wafer constituting a mask substrate.

Thereafter, for every die, a desired photoresist pattern 24 is formed on the second silicon oxide film 22 formed on the lower surface of the substrate 10, as shown in FIG. 5. Then, using the formed photoresist pattern as a mask, the second silicon oxide film 22 is patterned to form a second silicon oxide film pattern 22a, as shown in FIG. 6.

Next, using the second silicon oxide pattern 22a as a mask, the silicon nitride film 20 is patterned to form a silicon nitride film pattern 20a.

Subsequently, using the silicon nitride film pattern 20a as a mask, the first silicon oxide film 18 is patterned to form a first silicon oxide film pattern 18a, as shown in FIG. 7.

Following this, the lower surface of the substrate 10 is slantly etched using the first silicon oxide film 18a until the buried oxide film 12 is exposed. In this way, a stencil mask is fabricated.

In the above-described prior method for the fabrication of the stencil mask, the silicon nitride film 20 to be used as the etch mask on the lower surface of the semiconductor substrate 10 is formed over the entire surface of the wafer.

As generally known in the art, however, the silicon nitride film 20 in its nature is sensitive to stress depending on its thickness and surface area. In particular, cracks may be generated in the silicon nitride film in the direction of the applied stress. This may lead to the generation of defects throughout the entire surface of the wafer when etching the silicon substrate 10 at its lower surface.

Further, as shown in FIG. 7, when the silicon nitride film 20 is placed between the first silicon oxide film 18 and the second silicon oxide film 22, it is stressed by the underlying second silicon oxide film 22 and also due to the difference in the thermal expansive coefficients in every process, so that cracks are formed on the silicon nitride film 20. These cracks are infiltrated with a wet etching solution in a subsequent etching process, thereby causing defects throughout the entire surface of the wafer.

Meanwhile, FIG. 8 is a scanning electronic microscope photograph showing, in a cross-section, a lower surface structure of the semiconductor substrate 10 after the silicon nitride film pattern 20a is formed on the lower surface of the semiconductor substrate 10, and the first silicon oxide film 18 is then etched using the silicon nitride film pattern 20a as a mask. As can be seen in FIG. 8, the patterned silicon nitride film has the formed cracks.

AS described above, the disadvantage of the method for fabricating the stencil mask according to the prior art can be summarized as follows. When the silicon nitride film is placed between the first silicon oxide film and the second silicon oxide film, the silicon nitride film is stressed by the underlying second silicon oxide film and also due to the difference in the thermal expansive coefficients in every process, so that cracks are formed on the silicon nitride film. These cracks are problematic in that they are infiltrated with an wet etching solution in a subsequent etching process, thereby causing defects throughout the entire surface of the wafer.

SUMMARY OF THE INVENTION

It is therefore an objective of the present invention to provide a method for the fabrication of a stencil mask capable of inhibiting the generation of stress in the silicon nitride film.

In one embodiment, this invention provides a method of fabricating a stencil mask comprising steps of: preparing a mask substrate; forming a silicon nitride film over the entire lower surface of the mask substrate; patterning the silicon nitride film to divide it into at least two sub-portions; and patterning the mask substrate using the patterned silicon nitride film as a mask.

In an another embodiment, this invention provides a method of fabricating a stencil mask comprising steps of: (a) forming a fist silicon oxide film over the entire lower surface of a mask substrate; (b) forming a silicon nitride film over the entire exposed surface of the first oxide nitride film; (c) dividing the silicon nitride film into at least two sub-portions to form at least two primary silicon nitride film patterns; (d) patterning the primary silicon nitride film patterns into secondary silicon nitride film patterns, respectively; (e) patterning the first silicon oxide film using the secondary silicon nitride film patterns as a mask; and (f) patterning the mask substrate using the patterned first silicon oxide film as a mask.

BRIEF DESCRIPTION OF THE DRAWINGS

The foregoing and other objectives, features and advantages of the invention will be apparent to those skilled in the art to which the present invention relates from reading the following specification with reference to the accompanied drawings, in which.

DESCRIPTION OF THE PREFERRED EMBODIMENTS

Hereinafter, a stencil mask fabricating method of the present invention will be described, which involves the formation of a silicon nitride film over an entire surface of a mask substrate, a step of patterning the silicon nitride film conducted in such a fashion that the silicon nitride film is divided into at least two sub-portions, and the formation of desired patterns on the divided portions of the silicon nitride film.

According to the invention, on the silicon nitride film formed on the mask substrate, patterns having a structure highly resistant to stress are formed to disperse the stress applied to the silicon nitride film.

According to the invention, the silicon nitride film is formed over the entire surface of a wafer used as a mask substrate. After that, the silicon nitride film is divided into given sub-portions to form primary patterns of the silicon nitride film prior to its etching. Subsequently, desired secondary patterns are formed in the silicon nitride film, and the underlying silicon oxide film is then etched using the secondary patterns as a mask.

The stencil mask fabricated according to this invention can be employed in the lithographic process involving the use of light exposure devices using ion beams, X-rays, or a SCALPEL (Scattering Angular Limited Electron beam Lithography), etc. In particular, the stencil mask fabricated according to the invention is suitable to be used in an E-beam lithographic process.

Figure 1:
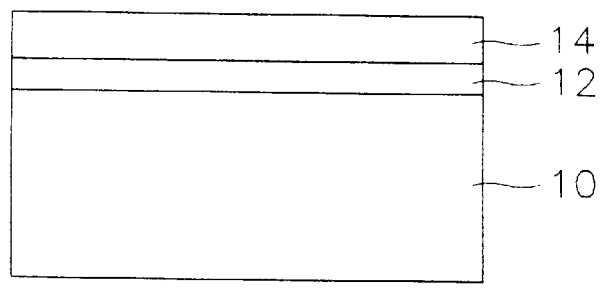
FIG. 1 through FIG. 7 are cross-sectional views for describing a method of fabricating a cell projection type mask according to the prior art, respectively.
Figure 2:
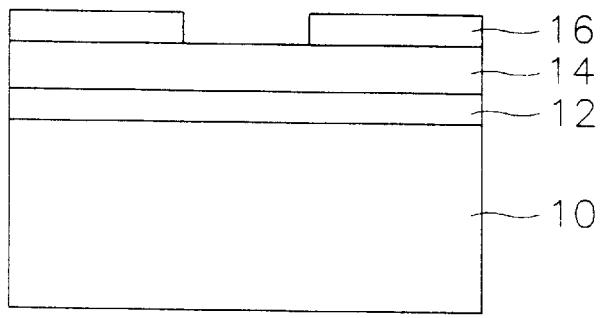
Figure 3:
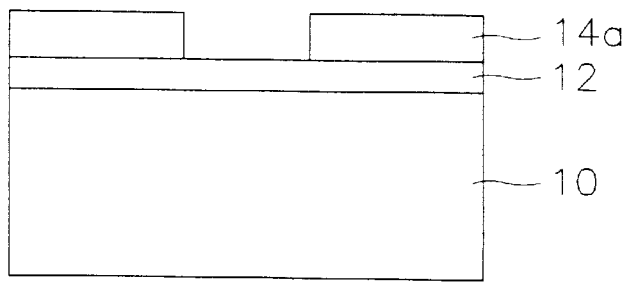
Figure 4:
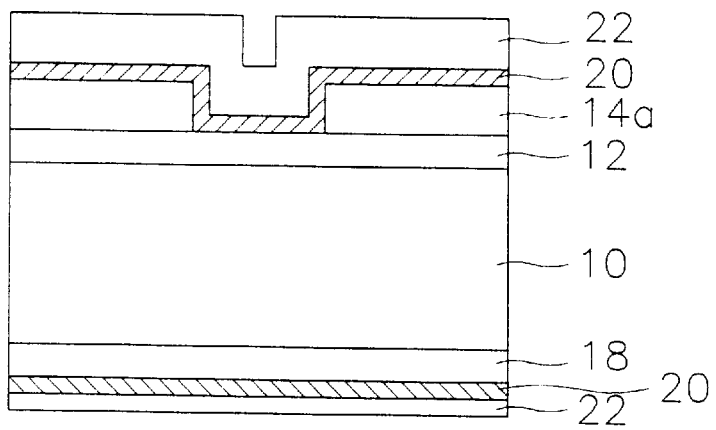
Figure 5:
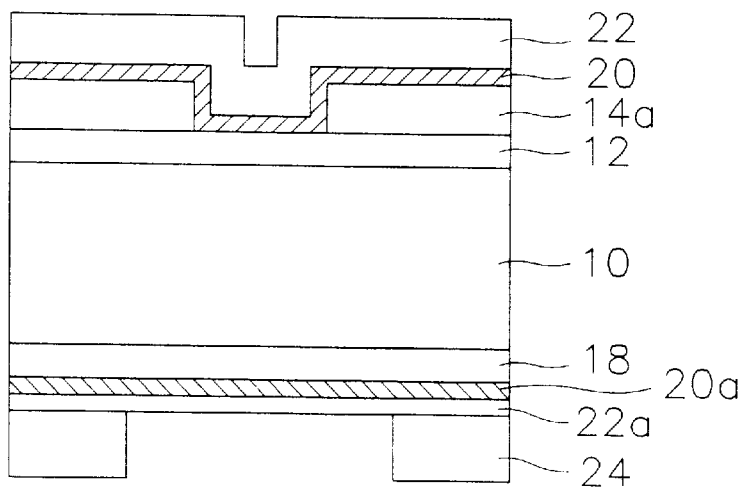
Figure 6:
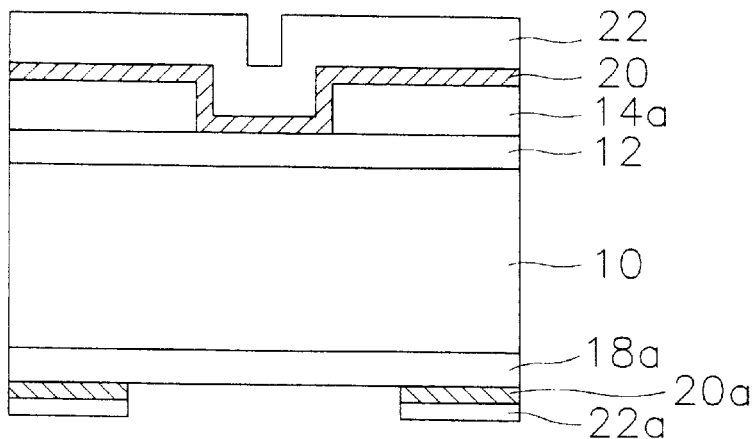
Figure 7:
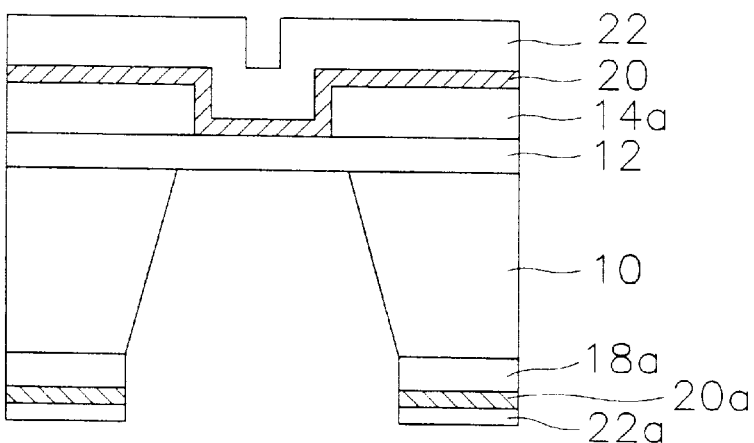
Figure 8:
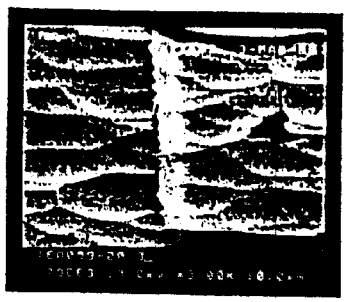
FIG. 8 is a scanning electronic microscope photograph showing, in a cross-section, a lower surface structure of a semiconductor substrate according to the prior art, after a silicon nitride film pattern is formed on a lower surface of the semiconductor substrate, and a first silicon oxide film is then etched using the silicon nitride film.
Figure 9:
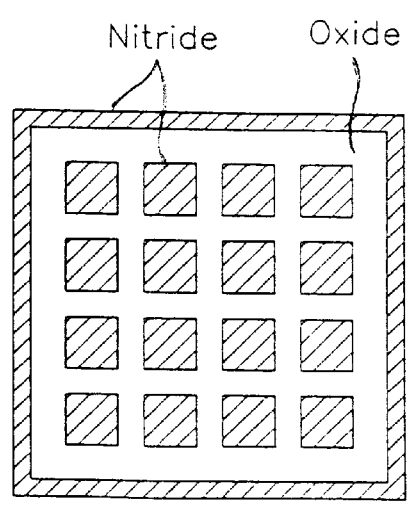
FIG. 9 is a plan view showing the divided areas of the silicon nitride film formed according to the present invention.

FIG. 9 is a plan view showing a primary pattern of a silicon nitride film formed during the fabrication procedure of a stencil mask according to the present invention.

As shown in FIG. 9, the silicon nitride film is divided into a plurality of sub-portions to form a primary pattern. The primary pattern is further patterned to form secondary patterns. The use of the secondary silicon nitride film patterns as a mask makes the area of the silicon nitride film smaller, which suffers from stress, compared to that of a silicon nitride film formed over the entire surface of the wafer. Therefore, the silicon nitride film formed according to the invention suffers from relatively less stress, thereby serving as a more stable wet etching mask.

FIG. 10 through FIG. 15 are cross-sectional views illustrating a method of fabricating a stencil mask according to the invention, respectively.

Figure 10:
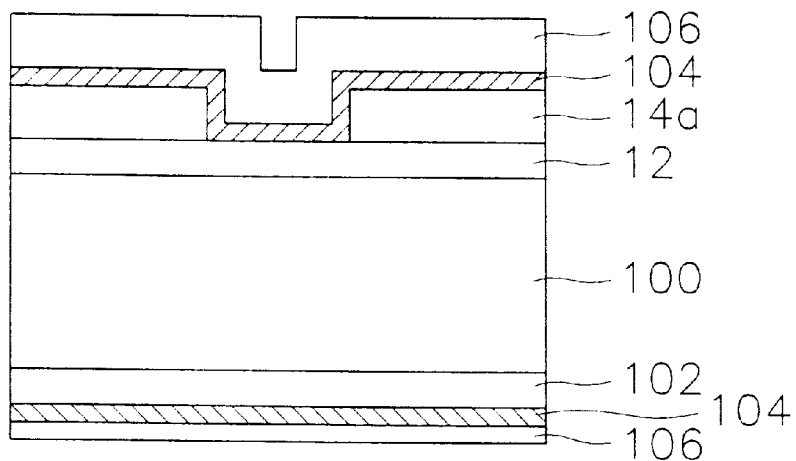
FIGS. 10 through 15 are cross-sectional views showing a method of forming a lower surface structure of a stencil mask according to the present invention, respectively.

The method for the fabrication of the stencil mask according to the invention comprises a preparation of a mask substrate 100 having a desired upper structure having a buried oxide film 12 and a silicon layer pattern 14a, as shown in FIG. 10. Then, a first silicon oxide film 102 is formed on the entire lower surface of the mask substrate 100 and then, a silicon nitride film 104 and a second oxide film 106 are formed sequentially on lower and upper surfaces of the substrate 100.

Figure 11:
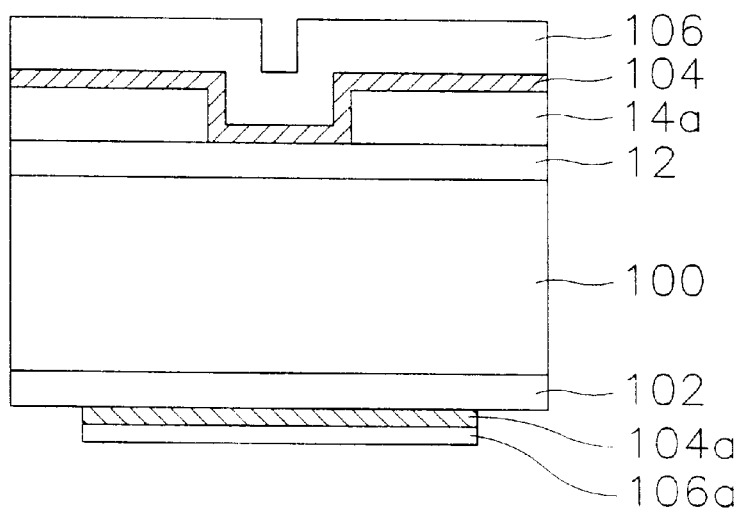

Next, a desired photoresist film pattern (not shown) is formed on the second silicon oxide film 106 formed on the lower surface of the substrate 100. The second silicon oxide film 106 is then etched using the formed photoresist film pattern as a mask to form a second silicon oxide film pattern 106a, as shown in FIG. 11.

After that, using the second silicon oxide film pattern 106a as a mask, the silicon nitride film 104 (see, FIG. 10) is patterned to form a primary silicon nitride film pattern 104a. In this case, the second silicon oxide film pattern 106a and the primary silicon nitride film 104a are formed in such a manner that they divide the second silicon oxide film 106 and the silicon nitride film 104 into a plurality of sub-portions, namely, dies, respectively, as shown in FIG. 9. FIG. 11 shows one of the divided dies.

Figure 12:
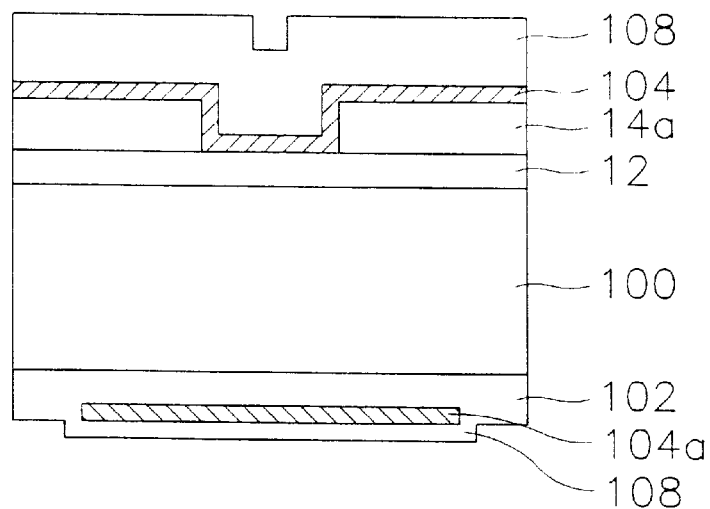

Thereafter, as shown in FIG. 12, a silicon oxide film is further formed on the lower and upper surfaces of the resultant substrate 100 to form a third silicon oxide film 108. Here, the third silicon oxide film 108 is integral with the second silicon oxide pattern 106a formed on the lower and upper surfaces of the surfaces 100 (see, FIG. 11).

Figure 13:
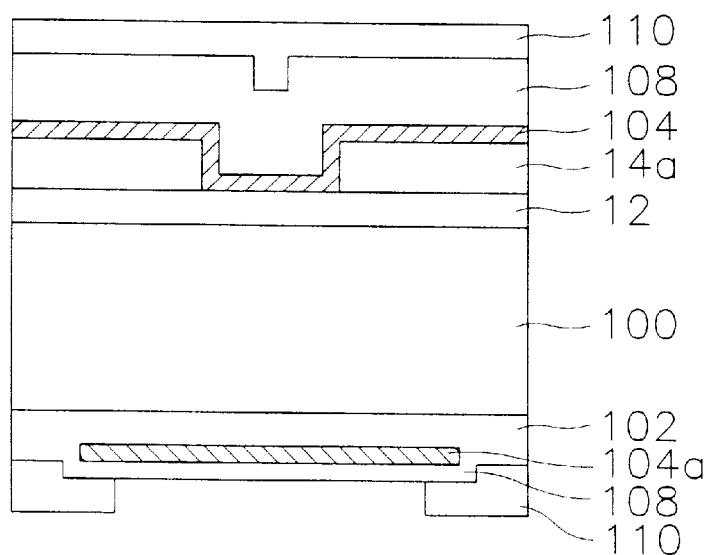
Figure 14:
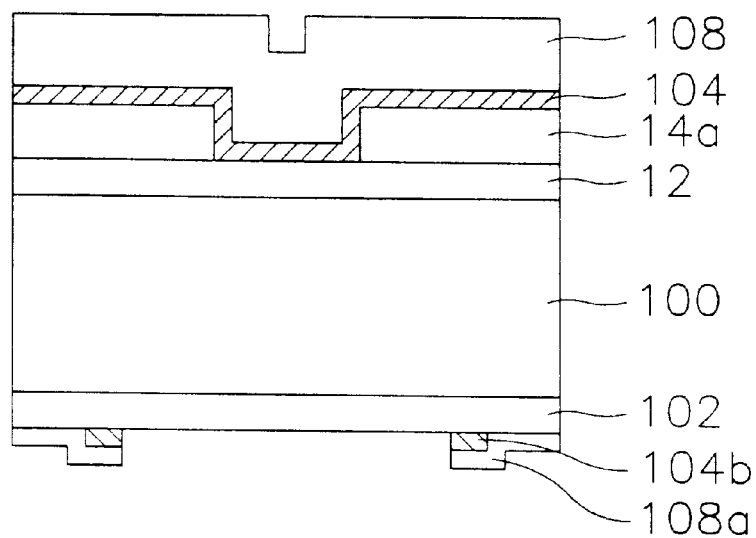

Afterwards, a desired photoresist film pattern 110 is formed on the third silicon oxide film 108, as shown in FIG. 13. Then, using the formed photoresist film pattern 110 as a mask, the third silicon oxide film 108 is patterned to form a third silicon oxide film pattern 108a, as shown in FIG. 14.

Thereafter, using the third silicon oxide film pattern 108a as a mask, the silicon nitride film pattern 104a is further patterned to form a secondary silicon nitride film pattern 104b.

The first silicon oxide film 102 is then patterned using the third silicon oxide film pattern 108a, thereby forming a first silicon oxide film pattern 102a. Thereafter, the third silicon oxide film pattern 108a is completely removed.

Figure 15:
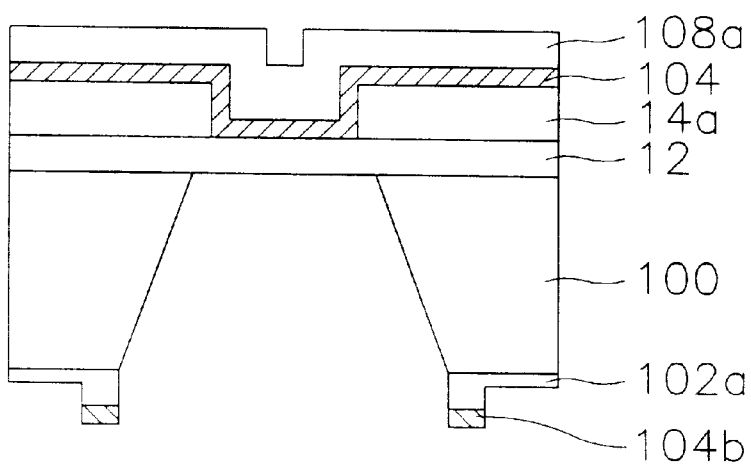

Following this, using the secondary first silicon oxide film pattern 102b as a mask, the mask substrate 100 is slantly etched, as shown in FIG. 15. Next, the first silicon oxide film pattern 102a is patterned again using the secondary silicon nitride film pattern 104b as a mask. In this way, a stencil mask is fabricated.

Generally, even if the direction of the stress in the silicon nitride film is sensitive to the thickness of the silicon nitride film, the degree of generation of the stress tends to depend on the silicon nitride film. Based on this phenomenon, the silicon nitride film formed over the entire surface of the wafer is divided into a plurality of sub-portions according to the invention. Thus, an area of the silicon nitride film to be patterned is reduced, thereby reducing the stress.

That is, in a case of forming a barrier by dividing the silicon nitride film into a small region, a stress acting on the silicon nitride film formed on lower surface of the wafer is smaller than another acting on the silicon nitride formed on the upper surface of the wafer.

Accordingly, the silicon nitride film on the lower surface of the wafer is subjected to the small stress so that the silicon nitride film reacts stably to the wet etch barrier.

Therefore, the present invention can be stable to the process of etching the lower surface of the silicon wafer thereby improving a throughput.

Although the preferred embodiments of the invention have been disclosed for illustrative purposes, those skilled in the art will appreciate that various modifications, additions and substitutions are possible without departing from the scope and spirit of the invention as disclosed in the accompanying claims.

What is claimed is:

1. A method of fabricating a stencil mask comprising steps of:

(a) preparing a mask substrate and forming a first silicon oxide film on a backside of said mask substrate;

(b) forming a silicon nitride film on said first silicon oxide film;

(c) etching outside of the silicon nitride film by a predetermined width to form a first silicon nitride pattern, said first silicon nitride pattern being larger than an opening area foreordinated to be formed on the backside of said mask substrate;

(d) etching inside of said first silicon nitride pattern by the area corresponding to said opening area to form a second silicon nitride pattern;

(e) etching inside of said first silicon oxide film until exposing said mask substrate by the area corresponding to said opening area to form a silicon oxide pattern; and (f) etching the backside of said mask substrate to form said opening using said second silicon nitride pattern and said silicon oxide pattern as an etching mask.

2. The method of claim 1, wherein the stencil mask is used in a lithographic process involving the use of a light source using ion beams, E-beams, X-rays, or a SCALPEL.

3. A method of fabricating a stencil mask comprising steps of:

(a) preparing a mask substrate and forming a first silicon oxide film on a backside of said mask substrate;

(b) forming a silicon nitride film on said first silicon oxide film;

(c) etching outside of the silicon nitride film by a predetermined width to form a first silicon nitride pattern, said first silicon nitride pattern being larger than an opening area foreordinated to be formed on the backside of said mask substrate;

(d) forming a second silicon oxide film on an entire surface of the resultant of step (c);

(e) etching inside of said second silicon oxide film by the area corresponding to said opening area to form a first silicon oxide pattern;

(f) etching inside of said first silicon nitride pattern by the area corresponding to said opening area to form a second silicon nitride pattern;

(g) etching inside of said first silicon oxide film until exposing said mask substrate by the area corresponding to said opening area to form a second silicon oxide pattern using said second silicon nitride pattern and said first silicon oxide pattern as an etching mask; and (h) etching the backside of said mask substrate to form said opening using said second silicon nitride pattern, said second silicon oxide pattern and optionally said first silicon oxide pattern as an etching mask.

* * * * *